(12) United States Patent
Celaya et al.

(10) Patent No.: US 8,461,670 B2
(45) Date of Patent: Jun. 11, 2013

(54) SEMICONDUCTOR COMPONENT AND METHOD OF MANUFACTURE

(75) Inventors: Phillip Celaya, Gilbert, AZ (US); Yeu Wen Lee, Negeri Sembilan (MY); Weng Onn Low, Negeri Sembilan (MY); Virgilio Abalos, Jr., Phoenix, AZ (US); Jamieson Wardall, Gilbert, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 324 days.

(21) Appl. No.: 12/827,980

(22) Filed: Jun. 30, 2010

(65) Prior Publication Data

US 2011/0298115 A1 Dec. 8, 2011

(30) Foreign Application Priority Data

Jun. 2, 2010 (MY) .............................. PI2010002543

(51) Int. Cl.
*H01L 23/495* (2006.01)
*H01L 23/48* (2006.01)
*H01L 21/50* (2006.01)

(52) U.S. Cl.
USPC ....................................................... 257/676

(58) Field of Classification Search
USPC .................. 257/341, 342, E23.141, 666–677, 257/E23.031–E23.059, E23.079, 500, 678–733, 257/288; 438/15, 25–28, 51, 55, 64–68, 438/106–127
See application file for complete search history.

(56) References Cited

U.S. PATENT DOCUMENTS

| | | | |
|---|---|---|---|
| 7,554,181 B2 | 6/2009 | Satou et al. | |
| 7,554,209 B2 | 6/2009 | Satou et al. | |
| 7,679,173 B2 * | 3/2010 | Uno et al. | 257/678 |
| 7,687,885 B2 | 3/2010 | Hashimoto et al. | |
| 7,732,919 B2 * | 6/2010 | Shimizu et al. | 257/724 |
| 2005/0269490 A1 * | 12/2005 | Loock et al. | 250/227.14 |
| 2005/0269590 A1 | 12/2005 | Kohjiro et al. | |
| 2007/0001300 A1 | 1/2007 | Kohjiro et al. | |
| 2008/0048777 A1 | 2/2008 | Kohjiro et al. | |

(Continued)

FOREIGN PATENT DOCUMENTS

JP 2004-342735 2/2004

OTHER PUBLICATIONS

Intel Coroporation; DrMOS Specifactions; Intel Corporation; 2004.

(Continued)

*Primary Examiner* — Dao H Nguyen
*Assistant Examiner* — Tram H Nguyen
(74) *Attorney, Agent, or Firm* — Rennie William Dover

(57) ABSTRACT

A semiconductor component and a method for manufacturing the semiconductor component, wherein the semiconductor component is configured to permit the determination of circuit parameters. A high side FET has a gate terminal coupled to an output terminal of a high side gate drive circuit, a drain terminal coupled for receiving an input voltage, and a source terminal coupled to the drain terminal of a low side FET. The gate terminal of the low side FET is coupled to the output terminal of low side drive circuit and the source terminal of the low side FET is coupled for receiving a source of operating potential. The high side gate drive circuit has a bias terminal coupled for receiving a floating potential where the bias terminal is electrically isolated or decoupled from the commonly connected source and drain terminals of the high side FET and the low side FET, respectively.

20 Claims, 7 Drawing Sheets

U.S. PATENT DOCUMENTS

| | | |
|---|---|---|
| 2009/0218683 A1 | 9/2009 | Satou et al. |
| 2010/0033237 A1 | 2/2010 | Liang et al. |
| 2010/0059875 A1 | 3/2010 | Sato et al. |
| 2010/0117225 A1* | 5/2010 | Shiraishi et al. ............... 257/723 |
| 2010/0127683 A1* | 5/2010 | Uno et al. ..................... 323/282 |
| 2010/0141229 A1* | 6/2010 | Satou et al. ................... 323/282 |
| 2011/0298115 A1* | 12/2011 | Celaya et al. ................. 257/676 |

OTHER PUBLICATIONS

On Semiconductor; NCP5383 Application Note; Semiconductor Components Industries, LLC., 2007; www.onsemi.com.

* cited by examiner

-PRIOR ART-

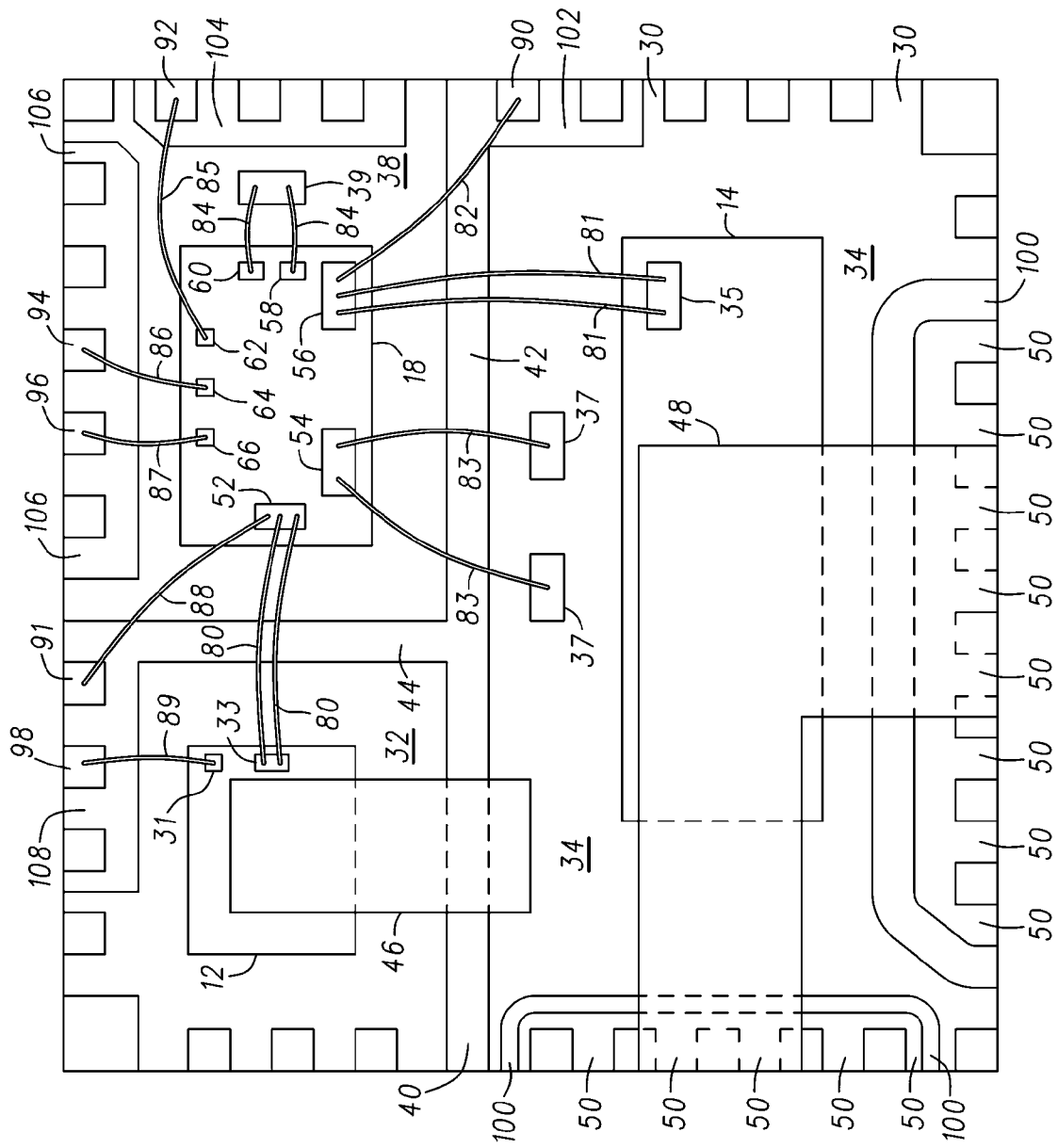
Fig. 2 -PRIOR ART-

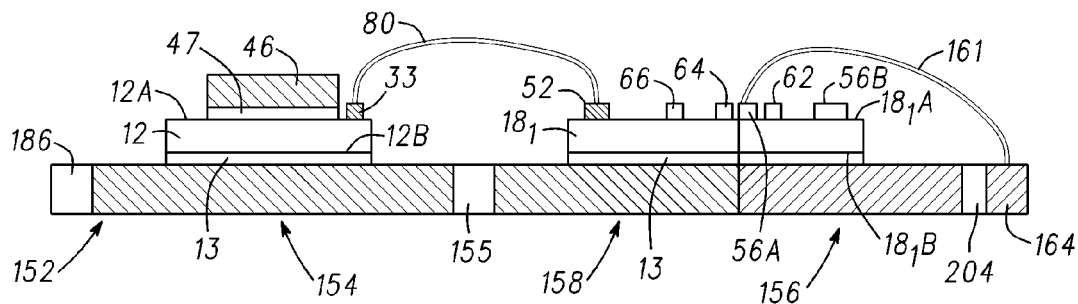
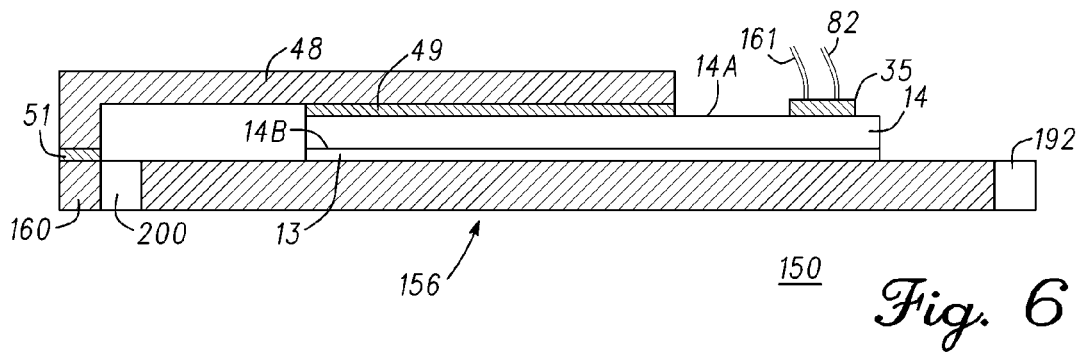
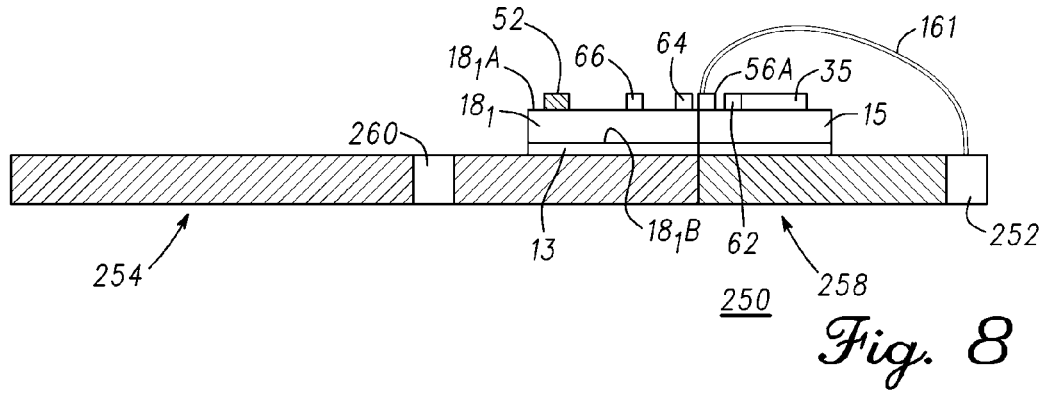
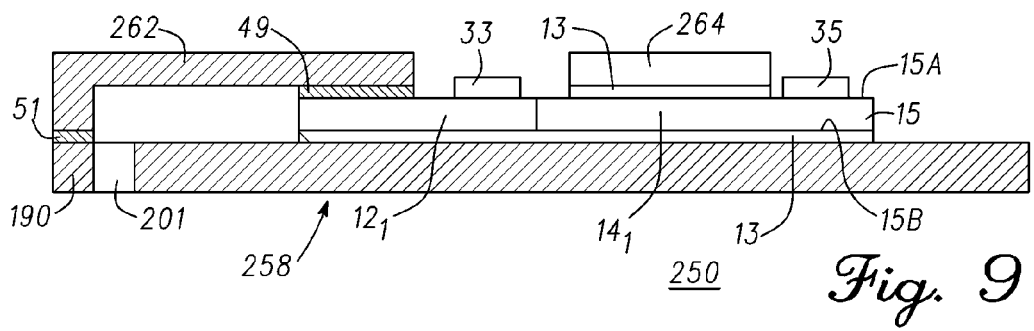

SEMICONDUCTOR COMPONENT AND METHOD OF MANUFACTURE

TECHNICAL FIELD

The present invention relates, in general, to electronics and, more particularly, to semiconductor components and testing the semiconductor components.

BACKGROUND

Generally, electronic systems are implemented using integrated devices, discrete semiconductor devices, or combinations of both integrated and discrete semiconductor devices. For example, in power conversion circuits an integrated control circuit drives discrete power Field Effect Transistors (FETS) to generate an output voltage at a switching node. In manufacturing these types of circuits, electrical nodes are coupled together in such a fashion as to preclude safely testing functional parameters associated with the electrical nodes. FIG. 1 is a circuit schematic of a prior art semiconductor component 10. Semiconductor component 10 includes a high side FET 12 connected to a low side FET 14. More particularly, high side FET 12 has a drain coupled for receiving an input signal $V_{IN}$, a source connected to a drain of low side FET 14 to form a phase or switching node 16, and a gate coupled for receiving a gate drive signal from a driver circuit 18. Low side FET 14 has a source coupled for receiving a source of operating potential $V_{SS}$ and a gate coupled for receiving a gate drive signal from driver circuit 18.

Driver circuit 18 includes a control circuit 20 having an input coupled for receiving a Pulse Width Modulation (PWM) signal, $V_{PWM}$, an output connected to a gate driver 22, and another output connected to a gate driver 24. The output of gate driver 22 is connected to the gate of high side FET 12 and to a monitoring terminal $G_H$. The output of gate driver 24 is connected to the gate of low side FET 14 and to a monitoring terminal $G_L$. Gate drivers 22 and 24 have inputs or supply terminals 25 and 27 coupled for receiving a source of operating potential $V_{DD}$. Gate driver 22 has an input 26 connected to node 16 and gate driver 24 has an input or supply terminal 28 coupled for receiving source of operating potential $V_{SS}$.

FIG. 2 is a top view of prior art semiconductor component 10 that is partially packaged. More particularly, FIG. 2 illustrates FETS 12 and 14 and driver circuit 18 in chip form and mounted on a leadframe 30 that has been singulated. In practice, FETS 12 and 14 are formed from a semiconductor wafer in which a drain is formed from a major surface and a source is formed from an opposing major surface. Similarly, driver circuit 18 is formed from a semiconductor wafer having active and contact surfaces. The semiconductor wafers from which FETS 12 and 14 and driver circuit 18 are manufactured are comprised of a semiconductor material and are diced into semiconductor die or chips. Thus, FETS 12 and 14 and driver circuit 18 are in chip or die form. Because FETS 12 and 14 and driver circuit 18 are represented by the circuit schematics shown in FIG. 1 but realized in chip form, reference characters 12, 14, and 18 are used to refer to the devices in both chip form and schematically. For the sake of explanation, the mold compound used to protect FETS 12 and 14 and driver circuit 18 has been omitted from FIG. 2. Leadframe 30 is preferably a copper leadframe that has semiconductor chip receiving areas 32, 34, and 38 to which FETS 12, 14, and driver circuit 18 have been attached, respectively. In addition, leadframe 30 has a plurality of leadframe leads 50, 90, 91, 92, 94, 96, and 98. Semiconductor chip receiving areas 32 and 34 are spaced apart from each other by a region 40, semiconductor chip receiving areas 34 and 38 are spaced apart from each other by a region 42, and semiconductor chip receiving areas 32 and 38 are spaced apart from each other by a region 44. As those skilled in the art are aware, in the absence of a mold compound, regions 40, 42, and 44 are open regions and when mold compound is present regions 40, 42, and 44 are filled with the mold compound.

The drain of FET 12, i.e., the bottom major surface, is electrically coupled to semiconductor chip receiving area 32 and the drain of FET 14 is electrically coupled to semiconductor chip receiving area 34. The source of FET 12 is electrically coupled to semiconductor chip receiving area 34, and therefore to the drain of FET 14, by an electrically conductive clip 46. Thus, semiconductor chip receiving area 34 serves as node 16 shown in FIG. 1. The source of FET 14, i.e., the top major surface, is electrically coupled to leadframe fingers 50 by an electrically conductive clip 48. The portions of leadframe 30 underlying clips 46 and 48 are shown as broken lines.

Driver circuit 18 has bond pads 52, 54, 56, 58, 60, 62, 64, and 66 formed on the active surface of its semiconductor material. Bond pad 52 is coupled to gate bond pad 33 of FET 12 by bond wires 80 and to leadframe lead 91 by bond wire 88; bond pad 54 is coupled to down bonds 37 of semiconductor chip receiving area 34 by bond wires 83; bond pad 56 is coupled to gate bond pad 35 of FET 14 by bond wires 81 and to leadframe lead 90 by bond wire 82; bond pads 58 and 60 are coupled to down bond 39 of semiconductor chip receiving area 38 by bond wires 84; bond pad 62 is coupled to leadframe lead 92 by bond wire 85; bond pad 64 is coupled to leadframe lead 94 by bond wire 86; bond pad 66 is coupled to leadframe lead 96 by bond wire 87; and bond pad 31 is coupled to leadframe lead 98 by bond wire 89. A down bond is a region in a support structure to which bond wires are typically bonded.

It should be noted that leadframe leads 50 and 90 are spaced apart from semiconductor chip receiving area 34 by regions 100 and 102, respectively; leadframe lead 92 is spaced apart from semiconductor chip receiving area 38 by region 104; leadframe leads 94 and 96 are spaced apart from semiconductor chip receiving area 38 by region 106; and leadframe leads 91 and 98 are spaced apart from semiconductor chip receiving area 32 by region 108. Like regions 40, 42, and 44, regions 100, 102, 104, 106, and 108 are open regions in the absence of mold compound and filled with mold compound when it is present.

Leadframe leads 90 and 91 are used to monitor the voltages at the gates of FETS 12 and 14, respectively. Thus, they receive signals $G_H$ and $G_L$ shown in FIG. 1.

Testing parameters in a semiconductor component that includes an integrated driver circuit coupled to and packaged with a FET is more challenging than testing an individual integrated driver circuit and an individual FET. An example of a packaged semiconductor component that includes an integrated driver circuit coupled to a FET is a driver MOSFET, commonly referred to as an integrated DrMOS. In these types of circuits, there is a risk of damaging the driver circuit when tests that involve the drain-to-source voltage of the low side FET are near or exceed the absolute maximum rating of the driver circuit. For example, testing the avalanche breakdown voltage (BVdss) of low side FET 14 involves injecting a current into node 16, i.e., the drain of low side FET 14. When the current becomes sufficiently high, low side FET 14 breaks down into the avalanche region and the voltage at the input of gate drive circuit 22 exceeds the maximum rated voltage for bias input 26 resulting in gate drive circuit 22 becoming damaged. Similarly, it is very difficult to perform unclamped inductive switching (UIS) tests on integrated DrMOS devices when the drain-to-source voltages of low side FET 14 exceeds the avalanche breakdown voltage.

Performing an Idss leakage test is very difficult when the drain-to-source voltage of low side FET 14 is close to the absolute maximum of the driver circuit. Since the drain of low side FET 14 is connected to input 16 of gate drive circuit 22, the Idss leakage current of low side FET 14 cannot be measured with any degree of accuracy due to the presence of multiple current paths. With low side FET 14 directly connected to driver circuit 18, low side FET 14 interferes with any voltage applied on SWN node 16 by pulling it down when the voltage on pin $G_L$ goes high. Examples of other tests that cannot be performed when low side FET 14 is directly connected to driver circuit 18 include zero cross detect threshold, SWN pre-overvoltage threshold testing, and Power On Reset (POR) threshold tests.

Accordingly, it would be advantageous to have a structure suitable for measuring electrical parameters such as breakdown voltage BVdss and leakage current Idss in a low side FET without damaging driver circuitry coupled to the low side FET and a method for manufacturing the structure. It would be of further advantage for the structure and method to be cost efficient and suitable for standardized packaging configurations.

BRIEF DESCRIPTION OF THE DRAWINGS

The present invention will be better understood from a reading of the following detailed description, taken in conjunction with the accompanying drawing figures, in which like reference characters designate like elements and in which:

FIG. 2 is top view of the prior art semiconductor component of FIG. 1 after singulation and in the absence of a mold compound;

FIG. 5 is a cross-sectional view of the semiconductor component of FIG. 4 taken along section line 5-5;

FIG. 6 is a cross-sectional view of the semiconductor component of FIG. 4 taken along section line 6-6;

FIG. 8 is a cross-sectional view of the semiconductor component of FIG. 7 taken along section line 8-8;

FIG. 9 is a cross-sectional view of the semiconductor component of FIG. 7 taken along section line 9-9;

DETAILED DESCRIPTION

Generally the present invention provides a semiconductor component and a method for manufacturing the semiconductor component that allows for determining parameters such as BVdss and Idss in a low side FET coupled in a chip module package. In accordance with embodiments of the present invention, a high side FET has a source terminal connected to the drain terminal of a low side FET to form a switching node, e.g., node 17 shown in FIG. 3. An output terminal of a gate drive circuit is coupled to the gate of the high side FET and an output terminal of another gate drive circuit is coupled to the gate of the low side FET. The gate drive circuit coupled to the high side FET has a floating supply input or terminal that is electrically isolated or decoupled from the switching node.

In accordance another aspect, the breakdown voltage BVdss and the leakage current of the low side FET can be determined without damaging the gate driver that is coupled to the gate of the high side FET because the floating supply input is electrically isolated from the switching node.

Figure 1:
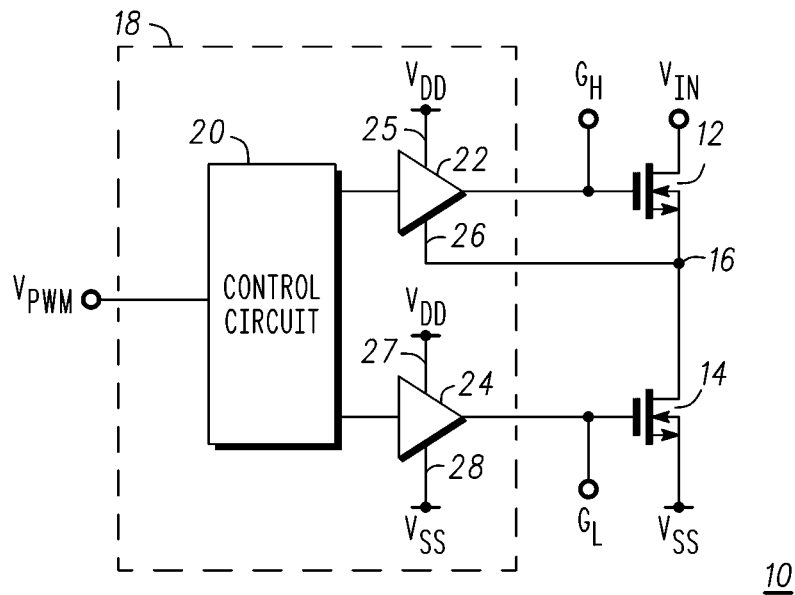
FIG. 1 is a circuit schematic of a prior art semiconductor component.
Figure 3:
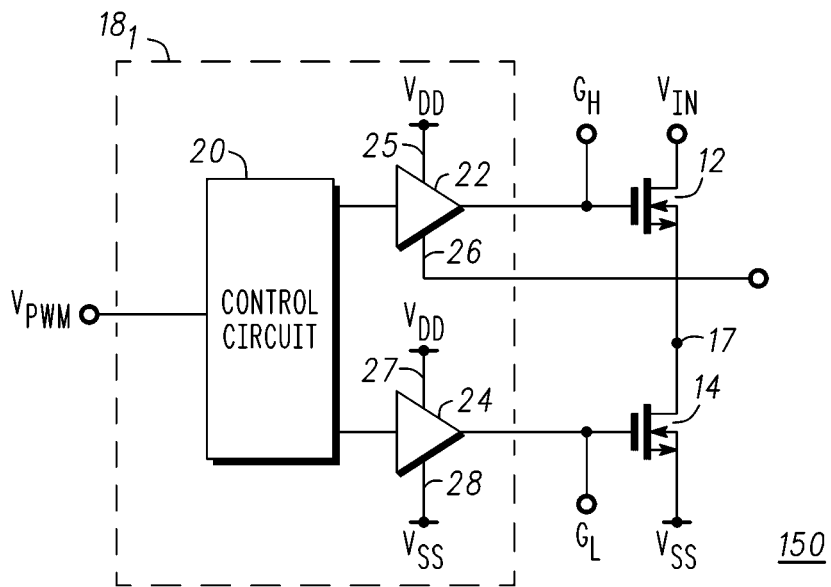
FIG. 3 is a circuit schematic of a semiconductor component in accordance with an embodiment of the present invention.

FIG. 3 is circuit schematic of a semiconductor component 150 in accordance with an embodiment of the present invention. Semiconductor component 150 includes high side FET 12 coupled to low side FET 14. More particularly, high side FET 12 has a drain coupled for receiving an input signal $V_{IN}$, a source connected to a drain of low side FET 14 to form a phase or switching node 17, and a gate coupled for receiving a gate drive signal from driver circuit 18₁. Low side FET 14 has a source coupled for receiving a source of operating potential $V_{SS}$ and a gate coupled for receiving a gate drive signal from driver circuit 18₁. Driver circuit 18₁ may also be referred to as a driver chip or an integrated circuit chip or a gate drive chip; the gate of a transistor such as FET 12 or FET 14 may be referred to as a control conductor or a control electrode; and the drain and source of a transistor may be referred to as current carrying conductors, current carrying terminals, or current carrying electrodes.

Driver circuit 18₁ includes a control circuit 20 having an input coupled for receiving a PWM signal, $V_{PWM}$, an output connected to a gate driver 22, and another output connected to a gate driver 24. The output of gate driver 22 is referred to as a gate drive node and is connected to the gate of high side FET 12 and to a monitoring terminal $G_H$. The output of gate driver 24 is referred to as a gate drive node and is connected to the gate of low side FET 14 and to a monitoring terminal $G_L$. By way of example, gate drivers 22 and 24 have inputs 25 and 27 that are coupled for receiving a source of operating potential $V_{DD}$ and an input 28 that is coupled for receiving source of operating potential $V_{SS}$. Inputs 25, 27, and 28 may be referred to as bias terminals. Input 26 may be referred to as a floating supply node.

Figure 4:
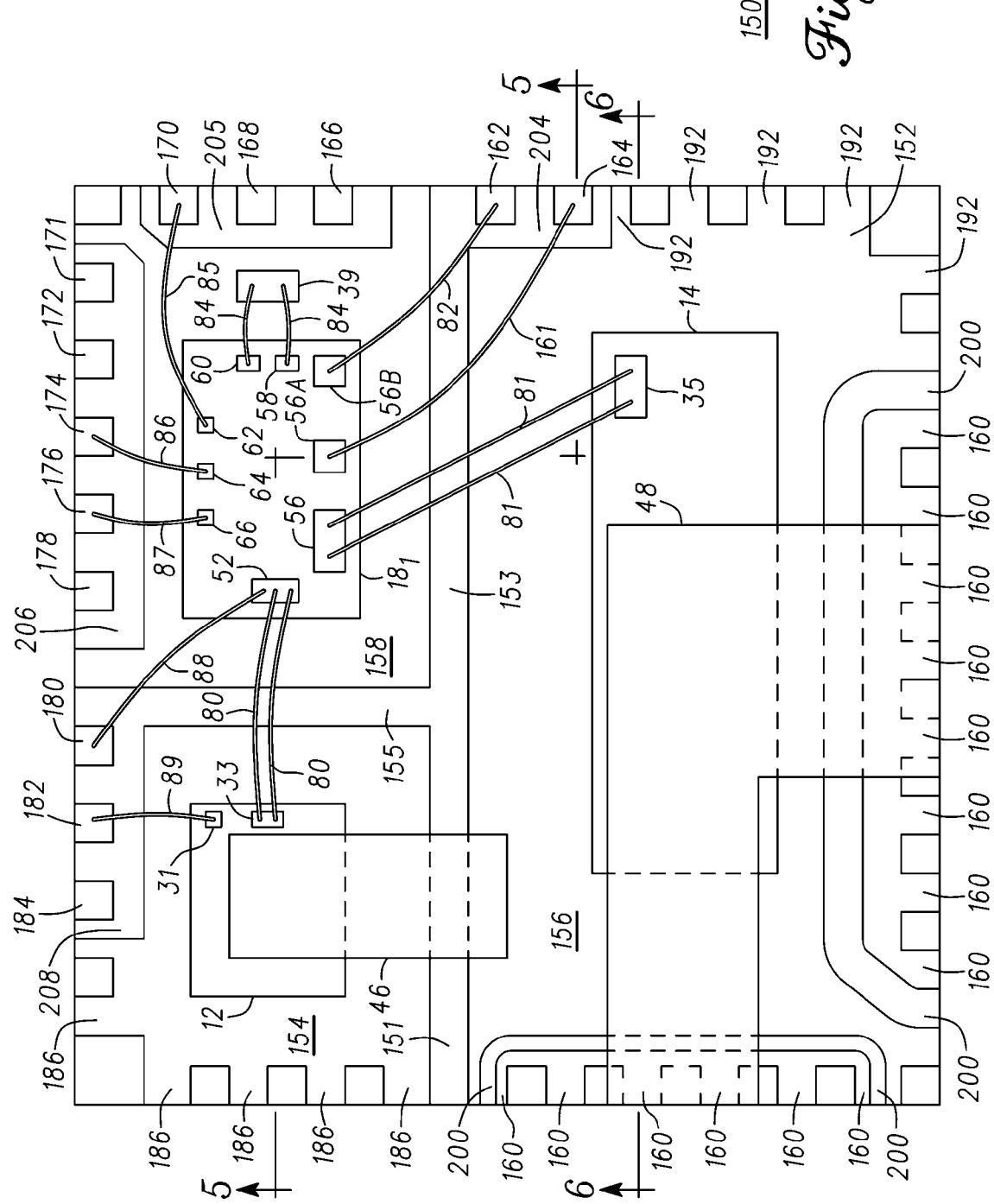
FIG. 4 is a top view of the semiconductor component of FIG. 3 after singulation from a leadframe strip and in the absence of a mold compound in accordance with an embodiment of the present invention.

FIG. 4 is a top view of semiconductor component 150 that is partially packaged in accordance with an embodiment of the present invention. More particularly, FIG. 4 illustrates FETS 12 and 14 and driver circuit 18₁ in chip form and mounted on a support structure 152 having semiconductor chip receiving areas 154, 156, and 158. Because FETS 12 and 14 are formed from semiconductor wafers that are comprised of a semiconductor material that is diced or cut into chips, they are also referred to as chips 12 and 14 in which a drain is formed from a major surface and a source is formed from an opposing major surface. More particularly, the drain of FET 12 is formed from surface 12B (shown in FIG. 5) and the source of FET 12 is formed from surface 12A (shown in FIG. 5), the drain of FET 14 is formed from surface 14A (shown in FIG. 6) and the source of FET 14 is formed from surface 14B (shown in FIG. 6). Similarly, driver circuit $18_1$ is formed from a semiconductor material in wafer form having major surfaces $18_1$A and $18_1$B (shown in FIG. 5). The semiconductor wafer is diced or cut into chips or die and is referred to as a chip $18_1$ having active and contact surfaces $18_1$A and $18_1$B, respectively. For the sake of explanation, the mold compound used to protect FETS 12 and 14 and driver circuit $18_1$ has been omitted from FIG. 4.

Support structure 152 may be, for example, a copper leadframe that has been singulated from a leadframe strip (not shown). FETS 12 and 14 are attached or coupled to semiconductor chip receiving areas 154 and 156, respectively, and driver circuit $18_1$ is attached or coupled to semiconductor chip receiving area 158. In addition, leadframe 152 has a plurality of leadframe leads 160, 162, 164, 166, 168, 170, 171, 172, 174, 176, 178, 180, 182, 184, 186, and 192. Leadframe 152 and leadframe leads 160-192 may be referred to as a support structure and support leads, respectively. Semiconductor chip receiving areas 154 and 156 are spaced apart from each other by a region 151, semiconductor chip receiving areas 156 and 158 are spaced apart from each other by a region 153, and semiconductor chip receiving areas 154 and 158 are spaced apart from each other by a region 155. As those skilled in the art are aware, in the absence of mold compound, regions 151, 153, and 155 are open regions and when mold compound is present regions 151, 153, and 155 may be filled with the mold compound. It should be noted that the configuration of support structure 152 is not a limitation of the present invention. For example, there may be more or fewer than three semiconductor chip receiving areas and a greater number or a lesser number of leadframe leads than leadframe leads 160-192. In addition, support structure 152 is not limited to being a metal leadframe such as, for example, a copper leadframe. Other suitable materials for support structure 152 include organic laminate substrates, ceramic substrates, or the like.

The drain of FET 12, i.e., the bottom major surface, is electrically coupled to semiconductor chip receiving area 154 and the drain of FET 14 is electrically coupled to semiconductor chip receiving area 156. The source of FET 12 is electrically coupled to semiconductor chip receiving area 156, and therefore to the drain of FET 14, by an electrically conductive clip 46. The source of FET 14, i.e., the top major surface, is electrically coupled to leadframe fingers 160 by an electrically conductive structure such as, for example, a clip 48. The portions of leadframe 152 underlying clips 46 and 48 are shown as broken lines. Bond pad 31 is connected to leadframe lead 182 by bond wire 89.

Driver circuit $18_1$ has bond pads 52, 56, 56A, 56B, 58, 60, 62, 64, and 66 formed from or on active surface $18_1$A. Bond pad 52 is coupled to gate bond pad 33 of FET 12 by bond wires 80 and to leadframe lead 180 by bond wire 88, bond pad 56 is coupled to gate bond pad 35 of FET 14 by bond wires 81; bond pad 56A is coupled to leadframe lead 164 by bond wire 161; bond pad 56B is coupled to leadframe lead 162 by bond wire 82; bond pads 58 and 60 are coupled to down bond 39 of semiconductor chip receiving area 158 by bond wires 84; bond pad 62 is connected to leadframe lead 170 by bond wire 85; bond pad 64 is connected to leadframe lead 174 by bond wire 86; and bond pad 66 is connected to leadframe lead 176 by bond wire 87. Bond pads 56, 56A, and 56B are electrically connected together within the substrate material of driver circuit $18_1$. Thus, when the substrate material of driver circuit $18_1$ is a semiconductor material, bond pads 56, 56A, and 56B are electrically connected together through the semiconductor material. Bond pads may also be referred to as electrical connectors.

It should be noted that leadframe leads 160 are spaced apart from semiconductor chip receiving area 156 by regions 200; leadframe leads 162 and 164 are spaced apart from semiconductor chip receiving area 156 by region 204; leadframe leads 166, 168, and 170 are spaced apart from semiconductor chip receiving area 158 by region 205; leadframe leads 171, 172, 174, 176, and 178 are spaced apart from semiconductor chip receiving area 158 by region 206; and leadframe leads 180, 182, and 184 are spaced apart from semiconductor chip receiving area 154 by region 208. Like regions 151, 153, and 155, regions 200, 204, 205, 206, and 208 are open regions in the absence of mold compound and may be filled with mold compound when it is present.

Leadframe leads 162 and 180 are used to monitor the voltage at the gates of FETS 12 and 14, respectively. Thus, they receive signals $G_H$ and $G_L$ shown in FIG. 3.

FIG. 5 is a cross-sectional view of semiconductor component 150 taken along section line 5-5 of FIG. 4. What is shown in FIG. 5 is semiconductor chip receiving areas 154, 158, and 156 of support structure 152. Semiconductor chip receiving area 154 is spaced apart from semiconductor chip receiving area 158 by region 155. Although not shown in the cross-sectional view of FIG. 5, semiconductor chip receiving area 158 is spaced apart from semiconductor chip receiving area 156 by a region 153. Semiconductor device 12 has opposing surfaces 12A and 12B and is coupled to semiconductor chip receiving area 154 through a die attach material 13, where surface 12B contacts die attach material 13. A bond pad 33 is formed on or from surface 12A. Clip 46 is coupled to surface 12A of semiconductor device 12 via an electrically conductive attach material 47.

Semiconductor chip $18_1$ has opposing surfaces $18_1$A and $18_1$B and is coupled to semiconductor chip receiving area 158 via a die attach material 13 where surface $18_1$B contacts die attach material 13. Bond pads 56, 56A, 56B, and 58-66 are formed on or from surface $18_1$A of semiconductor chip $18_1$. Bond pad 56A is coupled to leadframe lead 164 via bond wire 161 and bond pad 56B is coupled to leadframe lead 162 by bond wire 82 (not shown in FIG. 5).

FIG. 6 is a cross-sectional view of semiconductor component 150 taken along section line 6-6 of FIG. 4. What is shown in FIG. 6 is semiconductor device 14 coupled to semiconductor chip receiving area 156 via a die attach material 13. Semiconductor device 14 has opposing surfaces 14A and 14B where semiconductor surface 14B contacts die attach material 13. A portion of clip 48 is bonded to surface 14A of semiconductor device 14 through a chip attach material 49 and a portion of clip 48 is coupled to leadframe leads 160 through an attach material 51. Gate bond pad 35 is formed on or from a portion of surface 14A. As discussed before, semiconductor devices 12 and 14 may be referred to as semiconductor chips 12 and 14.

Figure 7:
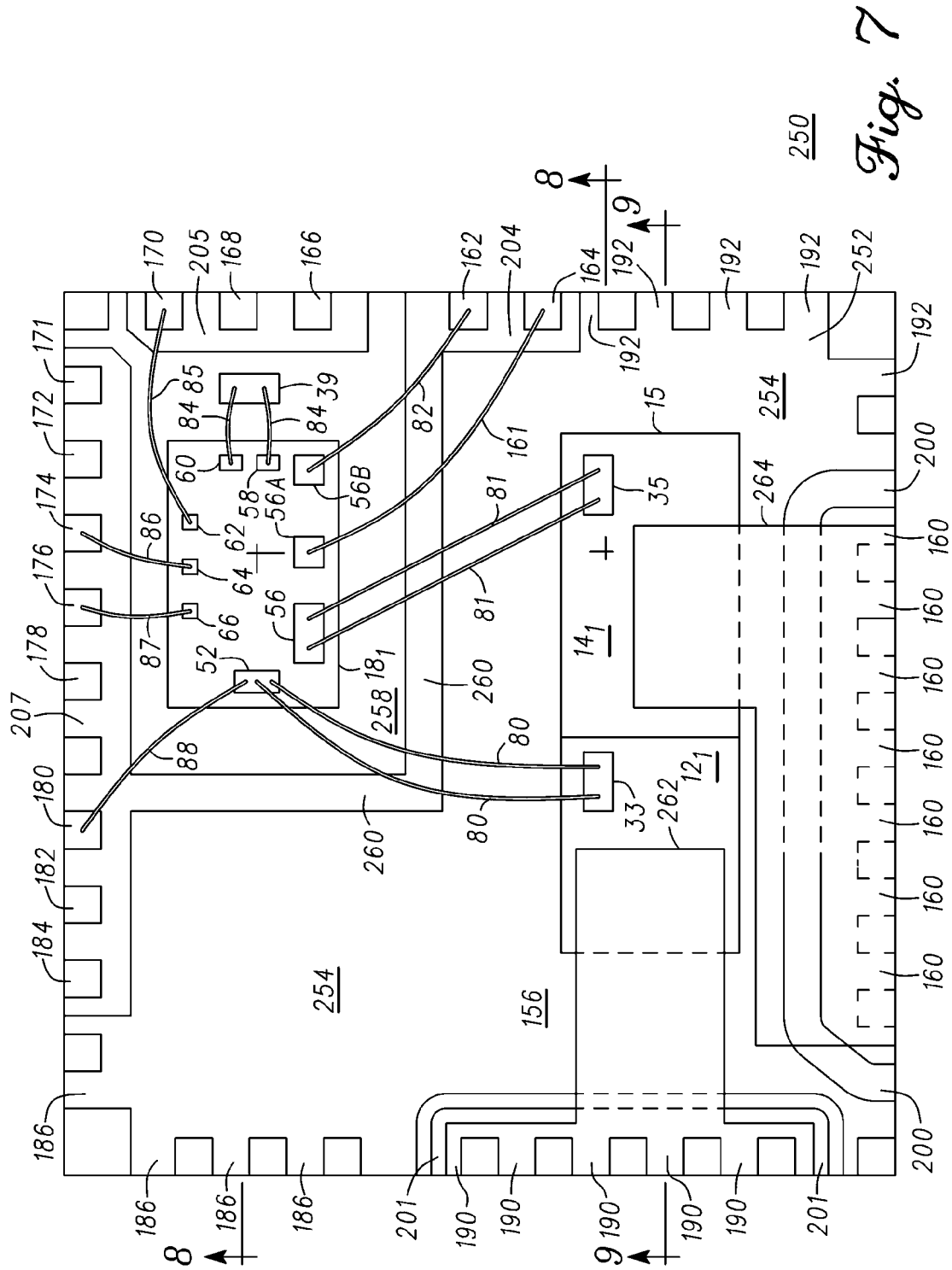
FIG. 7 is a top view of the semiconductor component of FIG. 3 after singulation from a leadframe strip and in the absence of a mold compound in accordance with another embodiment of the present invention.

FIG. 7 is a top view of semiconductor component 250 that is partially packaged in accordance with another embodiment of the present invention. More particularly, FIG. 7 illustrates FETS $12_1$ and $14_1$ and driver circuit $18_1$ in chip form and mounted on a support structure 252 having semiconductor chip receiving areas 254 and 258. In accordance with this embodiment, FETS $12_1$ and $14_1$ are formed in or from a single piece of semiconductor material where FET $12_1$ is formed in a portion of semiconductor chip 15 and FET $14_1$ is formed in another portion of semiconductor chip 15. Thus, FETS $12_1$ and $14_1$ are formed in a single semiconductor chip and the driver circuitry is formed in another semiconductor chip. Because the FETS of semiconductor component 150 are formed as two separate semiconductor chips and the FETS of semiconductor component 250 are formed as a single semiconductor chip, a subscripted reference character "1" has been added to reference characters 12 and 14 to distinguish the high and low side FETS of semiconductor component 150 from the high and low side FETS of semiconductor component 250. Accordingly, support structure 252 has two semiconductor chip receiving areas.

FET $12_1$ has a drain formed from a portion of a major surface and FET $14_1$ has a source formed from another portion of the major surface. For the sake of explanation, the mold compound used to protect FETS $12_1$ and $14_1$ and driver circuit $18_1$ has been omitted from FIG. 7. FET $12_1$ has a source formed from a portion of the opposing major surface and a drain formed from another portion of the opposing major surface. The source of FET $12_1$ is electrically connected to the drain of FET $14_1$ through a connection that is formed within the semiconductor material of semiconductor chip 15. By way of example, support structure 252 is a copper leadframe that has been singulated from a leadframe strip (not shown). FETS $12_1$ and $14_1$ are attached or coupled to semiconductor chip receiving area 254 and driver circuit $18_1$ is attached or coupled to semiconductor chip receiving area 256. Support structure 252 has a plurality of leadframe leads 160, 162, 164, 166, 168, 170, 171, 172, 174, 176, 178, 180, 186, 190, and 192. Semiconductor chip receiving areas 154 and 156 are spaced apart from each other by a region 260. In the absence of a mold compound, region 260 is an open region and when mold compound is present region 260 may be filled with the mold compound. It should be noted that the configuration of support structure 252 is not a limitation of the present invention. For example, there may be more or less than two semiconductor chip receiving areas and a greater number or a lesser number of leadframe leads than leadframe leads 160-192. In addition, the material of support structure 252 is not limited to being a metal such as, for example, copper. Other suitable materials for support 252 structure include organic laminate substrates, ceramic substrates, or the like.

The source of FET $12_1$, i.e., a portion of the bottom major surface of semiconductor chip 15, is electrically coupled to a portion of semiconductor chip receiving area 254 and the drain of FET $14_1$ is electrically coupled to another portion of semiconductor chip receiving area 254. The drain of FET $12_1$ is electrically coupled to leadframe leads 190 by an electrically conductive clip 262. The source of FET $14_1$, i.e., the top major surface, is electrically coupled to leadframe fingers 160 by an electrically conductive clip 264. The portions of leadframe 254 including leadframe leads 160 and 190 and regions 200 and 201 underlying clips 262 and 264 are shown as broken lines.

Driver circuit $18_1$ has bond pads 52, 56, 56A, 56B, 58, 60, 62, 64, and 66 formed on the active surface of its semiconductor material. Bond pad 52 is coupled to gate bond pad 33 of FET $12_1$ by bond wires 80 and to leadframe lead 180 by bond wire 88; bond pad 56 is coupled to gate bond pad 35 of FET $14_1$ by bond wires 81 and to leadframe lead 162 by bond wire 82; bond pad 56A is coupled to leadframe lead 164 by bond wire 161, bond pad 56B is coupled to leadframe lead 162 by bond wire 82; bond pads 58 and 60 are coupled to down bond 39 of semiconductor chip receiving area 258 by bond wires 84; bond pad 62 is connected to leadframe lead 170 by bond wire 85; bond pad 64 is connected to leadframe lead 174 by bond wire 86; bond pad 66 is connected to leadframe lead 176 by bond wire 87. The number of bond pads formed on or from the surface of driver circuit $18_1$ is not a limitation of the present invention.

It should be noted that leadframe leads 160 are spaced apart from semiconductor chip receiving area 156 by region 200; leadframe leads 162 and 164 are spaced apart from semiconductor chip receiving area 156 by region 204; leadframe leads 190 are spaced apart from semiconductor chip receiving area 254 by a region 201; leadframe leads 166, 168, and 170 are spaced apart from semiconductor chip receiving area 158 by region 205; and leadframe leads 171, 172, 174, 176, 178, and 180 are spaced apart from semiconductor chip receiving are 258 by region 207. Like regions 151, 153, and 155, regions 200, 201, 204, 205, and 207 are open regions in the absence of mold compound and may be filled with mold compound when it is present.

Leadframe leads 162 and 180 are used to monitor the voltage at the gates of FETS $12_1$ and $14_1$, respectively. Thus, they receive signals $G_H$ and $G_L$ shown in FIG. 3.

FIG. 8 is a cross-sectional view of semiconductor component 250 taken along section line 8-8 of FIG. 7. What is shown in FIG. 8 is semiconductor chip receiving areas 254 and 258 of support structure 252. Semiconductor chip receiving area 254 is spaced apart from semiconductor chip receiving 258 by region 260. Semiconductor chip $18_1$ has opposing surfaces $18_1$A and $18_1$B and is coupled to semiconductor chip receiving area 158 via a die attach material 13 where surface $18_1$B contacts die attach material 13. Bond pads 56, 56A, 56B, and 58-66 are formed on or from surface $18_1$A of semiconductor chip $18_1$. Bond pad 56A is coupled to leadframe lead 164 via bond wire 161 and bond pad 56B is coupled to leadframe lead 162 by bond wire 82 (not shown in FIG. 3). Semiconductor chip 15, which includes semiconductor devices $12_1$ and $14_1$, has opposing surfaces 15A and 15B where semiconductor surface 15B contacts die attach material 13. Gate bond pad 35 is formed on or from a portion of surface 15A that includes semiconductor device $14_1$.

FIG. 9 is a cross-sectional view of semiconductor component 250 taken along section line 9-9 of FIG. 7. What is shown in FIG. 9 is semiconductor device 15 coupled to semiconductor chip receiving area 254 via die attach material 13. Semiconductor device 15 has opposing surfaces 15A and 15B where semiconductor surface 15B contacts die attach material 13. A portion of clip 262 is bonded to a portion of surface 15A of semiconductor device 15 through attach material 49 and a portion of clip 262 is coupled to one or more leadframe leads 190 through attach material 51. Clip 262 is bonded to the portion of semiconductor chip 15 that includes semiconductor device $12_1$. Gate bond pads 33 and 35 are formed on or from portions of surface 15A. A portion of clip 264 is bonded to a portion of surface 15A through attach material 49. More particularly, clip 264 is bonded to the portion of semiconductor chip 15 that includes semiconductor device $14_1$.

The breakdown voltages of low side FETS 14 or $14_1$ of semiconductor components 150 and 250, respectively, can be determined by biasing FETS 12 or $12_1$ to be on and FETS 14 or $14_1$, respectively, to be off, coupling a current source to node 17, and injecting a current into the drain of low side FETS 14 or $14_1$. The level of the current is selected so that low side FETS 14 or $14_1$ break down. In addition, the leakage current of low side FETS 14 or $14_1$ and a few driver test parameters involving the SWN pin can be measured. An advantage of semiconductor components 150 and 250 is that floating supply terminal 26 is electrically isolated from node 17, i.e., the common node formed by coupling the drain terminals of FETS 14 or $14_1$ with the source terminals of FETS 12 or $12_1$, respectively.

Figure 10:
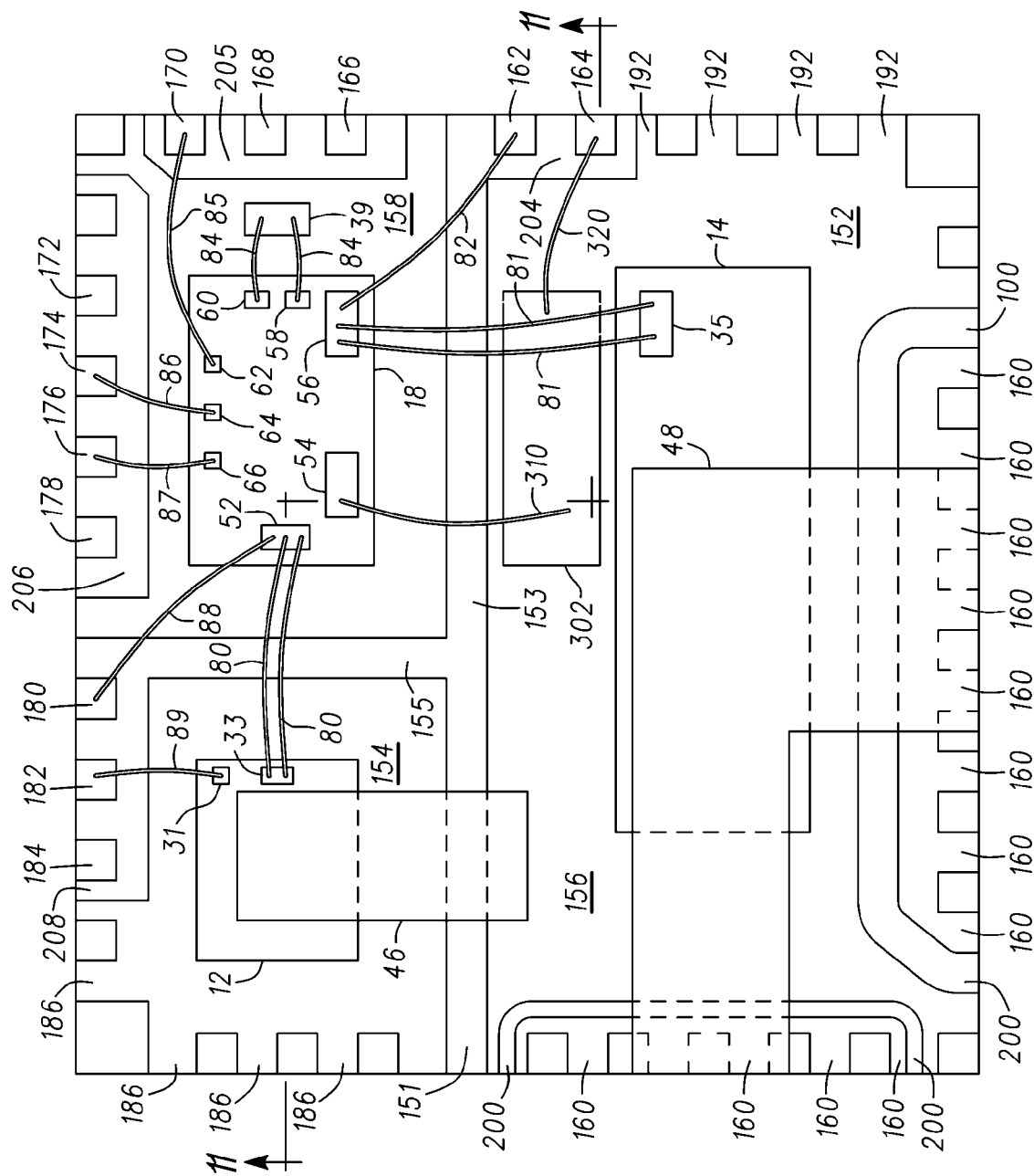
FIG. 10 is a top view of the semiconductor component of FIG. 3 after singulation from a leadframe strip and in the absence of a mold compound in accordance with another embodiment of the present invention.

FIG. 10 is a top view of a semiconductor component 300 that is partially packaged. More particularly, FIG. 10 illustrates FETS 12 and 14 and driver circuit 18 in chip form and mounted on a support structure 152 having semiconductor chip receiving areas 154, 156, and 158. Support structure 152, FETS 12 and 14, and driver circuit 18 have been described with reference to FIG. 4. An interposer 302 is coupled to semiconductor chip receiving area 156. In accordance with an embodiment, interposer 302 is comprised of an electrically insulating material having a coupling surface 304 and a bonding surface 306. Interposer 302 may be referred to as a dummy structure and is further described with reference to FIGS. 11-14. Coupling surface 304 may or may not be an electrically conductive surface. In accordance with various embodiments, bonding surface 306 is an electrically conductive surface. A layer of electrically conductive material is formed on bonding surface 306. Coupling surface 302 is attached to semiconductor chip receiving area 156 by an electrically nonconductive die attach material 308 (shown in FIGS. 11-14).

Driver circuit 18 has bond pads 52, 54, 56, 58, 60, 62, 64, and 66 formed on the active surface of its semiconductor material. Bond pad 52 is coupled to gate bond pad 33 of FET 12 by bond wires 80 and to leadframe lead 180 by bond wire 88, bond pad 54 is coupled to bonding surface 306 of dummy structure 302 by a bond wire 310, bond pad 56 is coupled to gate bond pad 35 of FET 14 by bond wires 81 and to leadframe lead 162 by bond wire 82; bond pads 58 and 60 are coupled to down bond 39 of semiconductor chip receiving area 158 by bond wires 84; bond pad 62 is connected to leadframe lead 170 by bond wire 85; bond pad 64 is connected to leadframe lead 174 by bond wire 86; bond pad 66 is connected to leadframe lead 176 by bond wire 87; and bond pad 31 is connected to leadframe lead 182 by bond wire 89. Bond pads may also be referred to as electrical connectors.

It should be noted that leadframe leads 160, 162, and 164 are spaced apart from semiconductor chip receiving area 156 by regions 200 and 204, respectively; leadframe leads 166, 168, and 170 are spaced apart from semiconductor chip receiving area 158 by region 205 and leadframe leads 172, 174, 176, and 178 are spaced apart from semiconductor chip receiving area 158 by region 206; and leadframe leads 180, 182, and 184 are spaced apart from semiconductor chip receiving area 154 by region 208. Like regions 151, 153, and 155, regions 200, 204, 205, 206, and 208 are open regions in the absence of mold compound and may be filled with mold compound when it is present.

Leadframe leads 162 and 180 are used to monitor the voltage at the gates of FETS 12 and 14, respectively. Thus, they receive signals $G_H$ and $G_L$ shown in FIG. 3.

Figure 11:
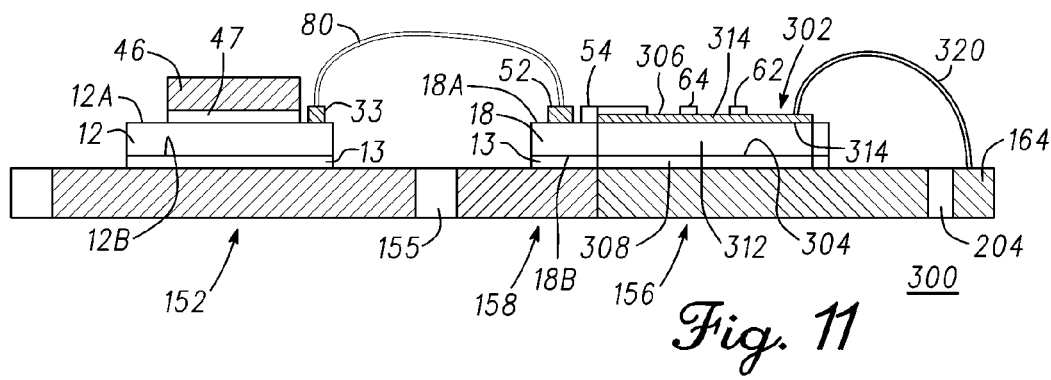
FIG. 11 a cross-sectional view of the semiconductor component of FIG. 10 taken along section line 11-11.

FIG. 11 is a cross-sectional view of semiconductor component 300 taken along section line 11-11 of FIG. 10. What is shown in FIG. 11 is semiconductor chip receiving areas 154, 158, and 156 of support structure 152. Semiconductor chip receiving area 154 is spaced apart from semiconductor chip receiving area 158 by region 155 and semiconductor chip receiving area 158 is spaced apart from semiconductor chip receiving area 156 by a region 153 (shown in FIG. 10). Semiconductor device 12 has opposing surfaces 12A and 12B and is coupled to semiconductor chip receiving area 154 through a die attach material 13, where surface 12B contacts die attach material 13. A bond pad 33 is formed on or from surface 12A. Clip 46 is coupled to surface 12A of semiconductor device 12 via an electrically conductive attach material 47.

Semiconductor chip 18 has opposing surfaces 18A and 18B and is coupled to semiconductor chip receiving area 158 via a die attach material 13 where surface 18B contacts die attach material 13. Bond pads 52 and 54 are formed on or from surface 18A of semiconductor chip 18.

Interposer 302 is coupled to semiconductor chip receiving area 156 via die attach material 308. Preferably die attach material 308 is an electrically non-conductive material. In accordance with various embodiments, interposer 302 is comprised of a substrate 312 having coupling surface 304 and an electrically conductive layer 314 having bonding surface 306. Suitable materials for substrate 312 include undoped silicon, a ceramic material, a plastic material, or other electrically non-conductive materials. By way of example, substrate 312 is a semiconductor chip and electrically conductive layer 314 is a layer of metal such as, for example, an aluminum copper metallization system, metal laminates such as, for example, a copper-molydenum-copper laminate, or the like. Bond pad 54 is coupled to electrically conductive layer 314 of interposer 302 by a wire bond 310 and interposer 302 is coupled to leadframe lead 164 via bond wire 320.

Figure 12:
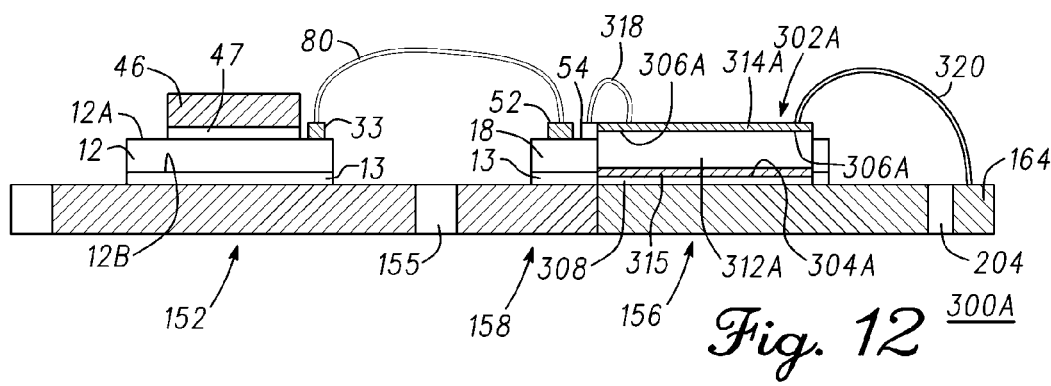
FIG. 12 a cross-sectional view of the semiconductor component of FIG. 10 taken in the region of section line 11-11 in accordance with another embodiment.

FIG. 12 is another cross-sectional view of semiconductor component 300A taken in the region of section line 11-11 of FIG. 10 in accordance with another embodiment. Semiconductor component 300A of FIG. 12 differs from semiconductor component 300 of FIG. 11 in that interposer 302 of FIG. 12 includes a layer of an electrically conductive material 314A having a surface which serves as bonding surface 306A and a layer of electrically conductive material 315 having a surface which serves as coupling surface 304B. Suitable materials for substrate 312 include undoped silicon, a ceramic material, a plastic material, or other electrically non-conductive materials. By way of example, substrate 312 is a ceramic substrate. To distinguish between the interposers of FIGS. 11 and 12, a reference character "A" has been attached to reference characters 300, 302, 304, 306, 312, and 314 in FIG. 12. Interposer 302A is coupled to semiconductor chip receiving area 156 via die attach material 308. It should be understood that in embodiments in which electrically conductive layer 315 is absent, the bottom surface of ceramic substrate 312A serves as coupling surface 306A. Suitable materials for electrically conductive layer 315 include an aluminum copper metallization system, metal laminates such as, for example, a copper-molydenum-copper laminate, or the like. Bond pad 54 is coupled to electrically conductive layer 314A of interposer 302A by a wire bond 318 and interposer 302A is coupled to leadframe lead 164 via bond wire 320.

Figure 13:
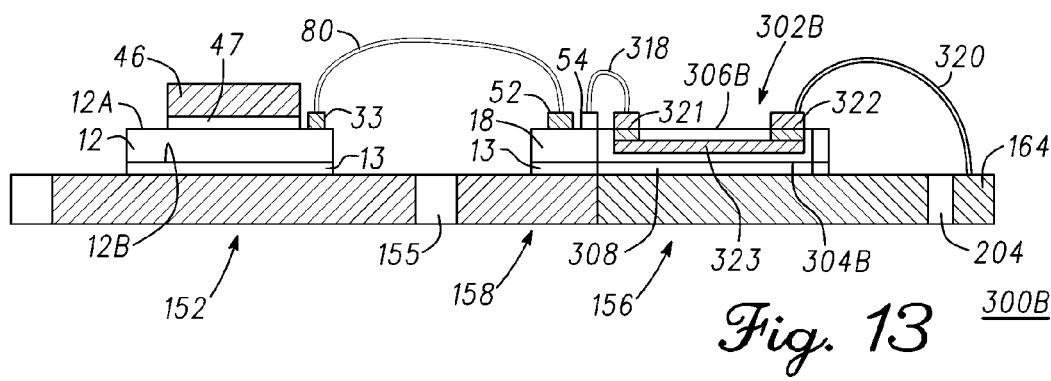
FIG. 13 is a cross-sectional view of the semiconductor component of FIG. 10 taken in the region of section line 11-11 in accordance with another embodiment.

FIG. 13 is a cross-sectional view of a semiconductor component 300B taken in the region of section line 11-11 of FIG. 10 in accordance with another embodiment. Semiconductor component 300B of FIG. 13 differs from semiconductor components 300 and 300A of FIGS. 11 and 12, respectively, in that substrate 312B of interposer 302B shown in FIG. 13 comprises a printed circuit board material. To distinguish between the interposers of FIGS. 11 and 12, a reference character "B" has been attached to reference character 302 in FIG. 13. Interposer 302B is coupled to semiconductor chip receiving area 156 via die attach material 308. In accordance with various embodiments, the substrate material of interposer 302B is comprised of a printed circuit board material having coupling surface 304B and bond pads 321 and 322 formed on or from bonding surface 306B. Bond pads 321 and 322 are electrically coupled together by an interconnect layer 323 formed within interposer 302B. Formation of interconnect layers within a printed circuit board are known to those skilled in the art. Optionally, interposer 302B includes an electrically conductive layer formed on its bottom surface, bond pads rather than an electrically conductive layer formed on its bottom surface where solder balls may be coupled to the bond pads, or the like. It should be understood that in embodiments in which electrically conductive layer 315 is absent, the bottom surface of substrate 312B serves as coupling surface 306B. Suitable materials for electrically conductive layer 315B include an aluminum copper metallization system, metal laminates such as, for example, a copper-molydenum-copper laminate, or the like. Bond pad 54 is coupled to bond pad 321 of interposer 302B by a bond wire 318 and bond pad 322 of interposer 302B is coupled to leadframe lead 164 via bond wire 320.

Figure 14:
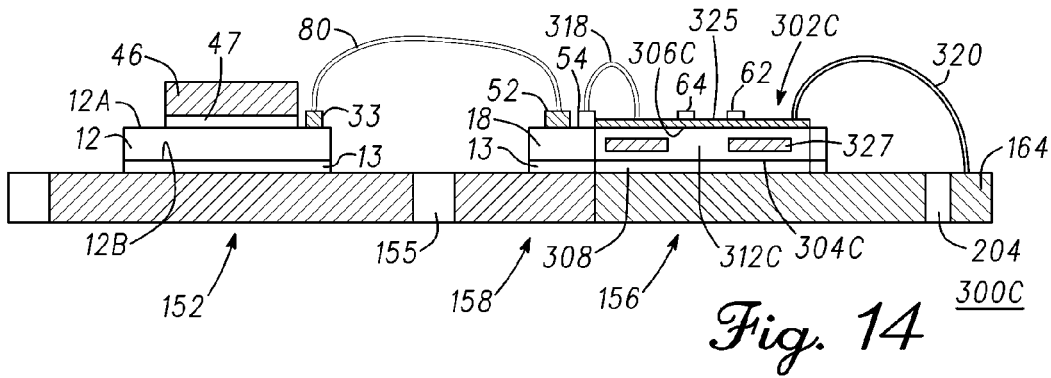
FIG. 14 is a cross-sectional view of the semiconductor component of FIG. 10 taken in the region of section line 11-11 in accordance with another embodiment.

FIG. 14 is a cross-sectional view of semiconductor component 300C taken in the region of section line 11-11 of FIG. 10 in accordance with another embodiment. Semiconductor component 300C differs from semiconductor component 300B (shown in FIG. 13) in that an electrically conductive layer 325 is formed on bonding surface 306B rather than bond pads 321 and 322. To distinguish between the interposers of FIGS. 11, 12, and 13, a reference character "C" has been attached to reference character 300, 302, 304, 306, and 312 in FIG. 14. Interposer 302C is coupled to semiconductor chip receiving area 156 via die attach material 308. In accordance with various embodiments, the substrate material of interposer 302C is comprised of a printed circuit board material having coupling surface 304C and electrically conductive layer 325 formed on or from bonding surface 306C and an electrically conductive layer 327 formed in interposer 302C. Optionally, electrically conductive layer 327 may be omitted from semiconductor component 300C so that coupling surface 304C is similar to coupling surface 304B shown in FIG. 13. Alternatively, interposer 302C includes an electrically conductive layer formed on its bottom surface, bond pads rather than an electrically conductive layer, solder balls coupled to the bond pads, or the like. It should be understood that in embodiments in which electrically conductive layer 315 is absent, the bottom surface of substrate 312C serves as coupling surface 304C. Suitable materials for electrically conductive layer 327 include an aluminum copper metallization system, metal laminates such as, for example, a copper-molydenum-copper laminate, or the like. Bond pad 54 is coupled to electrically conductive layer 325 by a bond wire 318 and electrically conductive layer 325 is coupled to leadframe lead 164 via bond wire 320.

Although specific embodiments have been disclosed herein, it is not intended that the invention be limited to the disclosed embodiments. Those skilled in the art will recognize that modifications and variations can be made without departing from the spirit of the invention. It is intended that the invention encompass all such modifications and variations as fall within the scope of the appended claims.

What is claimed is:

1. A semiconductor component, comprising:
a support structure having a plurality of support leads;
a driver chip mounted to a first portion of the support structure, the driver chip having a major surface, first and second gate drivers, and a plurality of bond pads formed at the major surface, the first gate driver having a first supply terminal, a second supply terminal, and a first output terminal, the second gate driver having a third supply terminal, a fourth supply terminal, and a second output terminal;
a first semiconductor device having a control conductor and first and second current carrying conductors, the first semiconductor device mounted to a second portion of the support structure, wherein the first current carrying conductor of the first semiconductor device is coupled to the second portion of the support structure;
a second semiconductor device having a control conductor and first and second current carrying conductors, the second semiconductor device mounted to a third portion of the support structure, wherein the second current carrying conductor of the second semiconductor device is coupled to the third portion of the support structure, and wherein the second current carrying conductor of the first semiconductor device is electrically coupled to the first current carrying conductor of the first semiconductor device at a node and the first and second supply terminals of the first gate driver and the third and fourth supply terminals of the second gate driver are electrically decoupled from the node; and
a first electrical connector coupling a first bond pad of the plurality of bond pads to a first support lead of the plurality of support leads, wherein the first bond pad is electrically isolated from the first and second current carrying conductors of the first and second semiconductor devices.

2. The semiconductor component of claim 1, further including a second electrical connector coupling the control conductor of the first semiconductor device to a second bond pad of the plurality of bond pads and a third electrical connector coupling the control conductor of the second semiconductor device to a third bond pad of the plurality of bond pads.

3. The semiconductor component of claim 2, further including a first electrically conductive structure that electrically couples the first current carrying conductor of the second semiconductor device to a second support lead of the plurality of support leads.

4. The semiconductor component of claim 1, wherein the support structure further includes first and second semiconductor chip receiving areas, wherein the first semiconductor chip receiving area includes the first portion of the support structure and the second semiconductor chip receiving area includes the second and third portions of the support structure.

5. The semiconductor component of claim 4, further including a semiconductor chip coupled to the second semiconductor chip receiving area, the semiconductor chip including the first and second semiconductor devices.

6. The semiconductor component of claim 5, wherein the second current carrying conductor of the second semiconductor device is coupled to the first current carrying conductor of the first semiconductor device.

7. The semiconductor component of claim 6, further including a first electrically conductive structure coupling the second current carrying conductor of the first semiconductor device to a second support lead of the plurality of support leads and a second electrically conductive structure coupling the first current carrying conductor of the second semiconductor device to a third support lead of the plurality of support leads.

8. The semiconductor component of claim 1, wherein the support structure further includes first, second, and third semiconductor chip receiving areas, wherein the first semiconductor chip receiving area includes the first portion of the support structure, the second semiconductor chip receiving area includes the second portion of the support structure, and the third semiconductor chip receiving area includes the third portion of the support structure.

9. The semiconductor component of claim 1, wherein the first electrical connector comprises, a plurality of bond wires and an interposer, and wherein the interposer is coupled to the third semiconductor chip receiving area, a first bond wire of the plurality of bond wires is coupled between the first bond pad of the plurality of bond pads and the interposer and a second bond wire of the plurality of bond wires is coupled between the interposer and the first support lead of the plurality of support leads.

10. The semiconductor component of claim 9, wherein the interposer comprises a substrate selected from the group of substrate comprising a semiconductor chip, a ceramic, and a printed circuit board.

11. The semiconductor component of claim 9, wherein the interposer comprises a semiconductor chip.

12. A semiconductor component, comprising:
a leadframe having at least one semiconductor chip receiving area and a plurality of leadframe leads;
an integrated circuit chip coupled to a first semiconductor chip receiving area of the at least one semiconductor chip receiving areas and having a plurality of bond pads at least a first gate driver having first and second supply terminals, the first supply terminal coupled to a first bond pad of the plurality of bond pads, and at least a second gate driver having first and second supply terminals;
a first semiconductor device having a control electrode and first and second current carrying electrodes, the first semiconductor device coupled to a second portion of the leadframe;
a second semiconductor device having a control electrode and first and second current carrying electrodes, the second semiconductor device coupled to a third portion of the leadframe; and
a first bond wire coupled from a second bond pad of the plurality of bond pads to a first leadframe lead of the plurality of leadframe leads, wherein the second current carrying electrode of the second semiconductor device and the first current carrying electrode of the first semiconductor device power transistor are electrically coupled together and electrically decoupled from the second bond pad of the plurality of bond pads and from the first and second supply terminals of the at least a first gate driver and from the first and second supply terminals of the at least a second gate driver.

13. The semiconductor component of claim 12, wherein the leadframe has second and third semiconductor chip receiving areas, the second portion of the leadframe in second semiconductor chip receiving area, and the third portion of the leadframe in the third semiconductor chip receiving area.

14. A semiconductor component, comprising:
a leadframe having at least one semiconductor chip receiving area and a plurality of leadframe leads;
an integrated circuit chip coupled to a first semiconductor chip receiving area of the at least one semiconductor chip receiving areas and having a plurality of bond pads and at least one gate driver having first and second supply terminals, the first supply terminal coupled to a first bond pad of the plurality of bond pads;
a first semiconductor device having a control electrode and first and second current carrying electrodes, the first semiconductor device coupled to a second portion of the leadframe;
a second semiconductor device having a control electrode and first and second current carrying electrodes, the second semiconductor device coupled to a third portion of the leadframe, wherein the first and second semiconductor devices are manufactured in a single semiconductor chip; and
a first bond wire coupled from a second bond pad of the plurality of bond pads to a first leadframe lead of the plurality of leadframe leads, wherein the second current carrying electrode of the second semiconductor device and the first current carrying electrode of the first semiconductor device are electrically coupled together and electrically decoupled from the second bond pad of the plurality of bond pads.

15. A method for manufacturing a semiconductor component, comprising:
providing a support structure having a major surface and a plurality of support leads;
providing first and second semiconductor devices and a gate drive chip, each of the first and second semiconductor devices having a control conductor and first and second current carrying conductors and the gate drive chip including first and second gate drive circuits, wherein each of the first and second gate drive circuits has drive nodes and first supply nodes and wherein the first gate drive circuit has a floating supply node;
coupling the gate drive chip to a first portion of the major surface;
coupling the floating supply node to a first lead of the plurality of supply leads;
coupling the first semiconductor device to a second portion of the major surface and the control conductor of the first semiconductor device to the gate drive node of the first drive circuit; and
coupling the second semiconductor device to a third portion of the major surface, the control conductor of the second semiconductor device to the gate drive node of the second drive circuit, and the second current carrying conductor of the second semiconductor device to the first current carrying conductor of the first semiconductor device, wherein the second current carrying conductor of the second semiconductor device and the first current carrying conductor of the second semiconductor device are electrically decoupled from the floating supply node.

16. The method of claim 15, wherein providing the first and second semiconductor devices includes providing the first semiconductor device in a first semiconductor chip and providing the second semiconductor device in a second semiconductor chip.

17. The method of claim 15, wherein coupling the floating supply node to a first lead of the plurality of supply leads includes coupling the floating supply node to an interposer and coupling the interposer to the first lead of the plurality of leads.

18. The method of claim 17, wherein the interposer comprises a substrate material selected from the group of substrate materials comprising a semiconductor chip, a ceramic substrate and a printed circuit board.

19. The method of claim 15, further including injecting a current into the second current carrying conductor of the second semiconductor device at least until the second semiconductor device breaks down, where the current is precluded from entering the floating supply node because the second current carrying conductor of the second semiconductor device and the first current carrying conductor of the second semiconductor device are electrically decoupled from the floating supply node.

20. The method of claim 15, further including measuring the leakage current of the second semiconductor device.

* * * * *